United States Patent
Qian et al.

(10) Patent No.: US 12,089,446 B2
(45) Date of Patent: Sep. 10, 2024

(54) DISPLAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Yuhan Qian, Beijing (CN); Libin Liu, Beijing (CN); Jiangnan Lu, Beijing (CN); Mei Li, Beijing (CN); Shiming Shi, Beijing (CN); Jie Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 378 days.

(21) Appl. No.: 17/599,007

(22) PCT Filed: Feb. 25, 2021

(86) PCT No.: PCT/CN2021/077846
§ 371 (c)(1),
(2) Date: Sep. 28, 2021

(87) PCT Pub. No.: WO2021/170031
PCT Pub. Date: Sep. 2, 2021

(65) Prior Publication Data
US 2022/0181419 A1    Jun. 9, 2022

(30) Foreign Application Priority Data
Feb. 28, 2020   (CN) .......................... 202010127027.2

(51) Int. Cl.
*H01L 29/08*       (2006.01)
*H10K 50/15*       (2023.01)
(Continued)

(52) U.S. Cl.
CPC ......... *H10K 59/1213* (2023.02); *H10K 50/15* (2023.02); *H10K 50/16* (2023.02);
(Continued)

(58) Field of Classification Search
CPC ........... H10K 59/1213; H10K 59/1216; H10K 59/131; H10K 50/171; H10K 50/15; H10K 71/00
(Continued)

(56) References Cited

U.S. PATENT DOCUMENTS 9,299,950 B2     3/2016  Song et al.
2002/0158835 A1  10/2002 Kobayashi
(Continued)

FOREIGN PATENT DOCUMENTS

CN    101882601 A    11/2010
CN    105206220 A    12/2015
(Continued)

OTHER PUBLICATIONS

China Patent Office, First Office Action issued Feb. 7, 2022 for application No. CN202010127027.2.

*Primary Examiner* — Phuc T Dang
(74) *Attorney, Agent, or Firm* — HOUTTEMAN LAW LLC (57) ABSTRACT

A display substrate includes: a base substrate; a light-emitting unit in each pixel region and including a first electrode, an organic light-emitting layer, and a second electrode sequentially disposed in a direction away from the base substrate; an auxiliary conductive layer between the light-emitting unit and the base substrate; a pixel circuit in each pixel region and including a driving transistor. The auxiliary conductive layer is on a side of the pixel circuit away from the base substrate, the second electrode has a portion extending out of the pixel region and coupling to the auxiliary conductive layer through a via hole not overlapping the pixel region, the auxiliary conductive layer is insulated and spaced apart from the first electrode and has a mesh or chain shape, and a material of the auxiliary con-
(Continued)

ductive layer is the same as a material of the first and second electrodes of the driving transistor.

19 Claims, 7 Drawing Sheets

(51) Int. Cl.
    *H10K 50/16*       (2023.01)
    *H10K 50/17*       (2023.01)
    *H10K 59/121*     (2023.01)
    *H10K 59/131*     (2023.01)
    *H10K 71/00*       (2023.01)
    *H10K 59/12*      (2023.01)

(52) U.S. Cl.
    CPC ....... *H10K 50/171* (2023.02); *H10K 59/1216* (2023.02); *H10K 59/131* (2023.02); *H10K 71/00* (2023.02); *H10K 59/1201* (2023.02)

(58) Field of Classification Search
    USPC .................................................. 257/46, 40
    See application file for complete search history.

(56) References Cited

U.S. PATENT DOCUMENTS

| | | |
|---|---|---|
| 2014/0131677 A1 | 5/2014 | Oh et al. |
| 2014/0367651 A1 | 12/2014 | Song et al. |
| 2020/0027903 A1* | 1/2020 | Tian ................... H10K 59/131 |
| 2020/0343315 A1* | 10/2020 | Lin ....................... H10K 59/35 |

FOREIGN PATENT DOCUMENTS

| | | | | |
|---|---|---|---|---|
| CN | 206194348 U | 5/2017 | | |
| CN | 107680533 A | 2/2018 | | |
| CN | 110010058 A | 7/2019 | | |
| CN | 110071225 A | 7/2019 | | |
| CN | 110098222 A | * 8/2019 | .......... | H01L 27/3211 |
| CN | 110391348 A | 10/2019 | | |
| CN | 110808340 A | 2/2020 | | |
| KR | 20140085979 A | * 7/2014 | .......... | H10K 59/131 |
| KR | 20180047584 A | * 5/2018 | ......... | H10K 59/1213 |

* cited by examiner

DISPLAY SUBSTRATE, MANUFACTURING METHOD THEREOF AND DISPLAY DEVICE

TECHNICAL FIELD

The present application relates to the field of display technologies, in particular to a display substrate, a method for manufacturing the same, and a display device.

BACKGROUND

In an Organic Light-Emitting Diode (OLED) display device, a light-emitting unit is disposed in each pixel and includes an anode, a light-emitting layer on the anode, and a cathode on the light-emitting layer. Typically, the cathodes of the light-emitting units are interconnected to form an integral cathode layer. The driving signal terminal located around the display area supplies a voltage for the cathode layer, and a certain voltage drop occurs in the cathode layer due to the large resistance thereof, which may result in increased driving power consumption. Moreover, the distances from different light-emitting units to the driving signal terminal are different, so that the driving currents supplied to the light-emitting units in the pixels are not exactly the same, thereby resulting in uneven display brightness of the display device.

SUMMARY

As a first aspect, the present disclosure provides a display substrate having a plurality of pixel regions spaced apart from each other, including: a base substrate; a light-emitting unit in each pixel region and including a first electrode, an organic light-emitting layer and a second electrode, which are sequentially disposed in a direction away from the base substrate; an auxiliary conductive layer between the light-emitting unit and the base substrate in a vertical direction; a pixel circuit in each pixel region and including a driving transistor configured to supply a driving current to the light-emitting unit. The auxiliary conductive layer is on a side of the pixel circuit away from the base substrate, each second electrode has a portion extending out of the pixel region and coupling to the auxiliary conductive layer through a via hole not overlapping the pixel region, the auxiliary conductive layer is insulated and spaced apart from the first electrode and has a mesh or chain shape in a plan view, and a material of the auxiliary conductive layer is the same as a material of each of the first electrode and the second electrode of the driving transistor.

In some embodiments, the second electrodes of the light-emitting units are coupled to be a single piece to form a second electrode layer, and a portion of the second electrode layer outside the pixel region is coupled to the auxiliary conductive layer through the via hole.

In some embodiments, the light-emitting unit is a light-emitting diode, and the second electrode is a cathode of the light-emitting diode.

In some embodiments, the display substrate further includes: an insulating spacer layer between the second electrode layer and the base substrate with the via hole penetrating through the insulating spacer layer.

In some embodiments, the auxiliary conductive layer includes a plurality of auxiliary conductive blocks and a plurality of auxiliary conductive lines, each of the plurality of auxiliary conductive blocks is electrically coupled to a corresponding one of the second electrodes through a corresponding one of the via holes and is electrically coupled to at least one auxiliary conductive line, and a width of the auxiliary conductive block is larger than a width of the auxiliary conductive line.

In some embodiments, an orthographic projection of the respective via hole on the base substrate is within an orthographic projection of the auxiliary conductive block on the base substrate.

In some embodiments, a space between a boundary of the orthographic projection of the respective via hole on the base substrate and a boundary of the orthographic projection of the auxiliary conductive block on the base substrate is between 4 μm and 7 μm.

In some embodiments, the width of the auxiliary conductive block is two to five times the width of the auxiliary conductive line.

In some embodiments, the plurality of auxiliary conductive lines are in a mesh shape in plan view, and an orthographic projection of the auxiliary conductive line overlaps with an orthographic projection of the light-emitting unit on the base substrate.

In some embodiments, the orthographic projection of the auxiliary conductive line on the base substrate penetrates through a center of an orthographic projection of at least one light-emitting unit on the base substrate.

In some embodiments, the plurality of auxiliary conductive lines includes a plurality of first conductive lines and a plurality of second conductive lines intersecting perpendicularly to each other.

In some embodiments, the orthographic projection of the auxiliary conductive line on the base substrate does not overlap with an orthographic projection of the light-emitting unit on the base substrate.

In some embodiments, the plurality of auxiliary conductive lines constitute a mesh structure having a plurality of rows of meshes, and adjacent two rows of meshes are staggered.

In some embodiments, the plurality of auxiliary conductive lines constitute a plurality of chain structures spaced apart from each other in a first direction, and each of the plurality of chain structures includes a plurality of polygonal boxes connected sequentially in a second direction.

In some embodiments, the pixel circuit further includes a capacitor, a reset sub-circuit, a data writing sub-circuit, a compensation sub-circuit and an emission control sub-circuit. The reset sub-circuit is configured to transmit a voltage signal at a reference voltage terminal to a first end of the capacitor and transmit a voltage signal at an initialization voltage terminal to a second end of the capacitor in response to a control of a reset terminal during a reset phase. A gate electrode of the driving transistor is coupled to the second end of the capacitor and a first electrode of the driving transistor is coupled to a first power supply terminal. The data writing sub-circuit is configured to transmit a voltage signal at a data signal terminal to the first end of the capacitor in response to a control of a scan terminal during a data writing phase. The compensation sub-circuit is configured to electrically couple the gate electrode of the driving transistor with a second electrode of the driving transistor in response to a control of the scan terminal during a data writing phase to write a voltage at the first power supply terminal and a threshold voltage of the driving transistor into the capacitor. The emission control sub-circuit is configured to transmit the voltage signal at the reference voltage terminal to the first end of the capacitor in response to a control of the emission control signal terminal during an emission phase and to electrically couple the second electrode of the driving transistor with a first electrode of the light-emitting unit.

In some embodiments, the reset sub-circuit includes a first reset transistor and a second reset transistor. A gate electrode of the first reset transistor is coupled to the reset terminal, a first electrode of the first reset transistor is coupled to the reference voltage terminal, and a second electrode of the first reset transistor is coupled to a first end of the capacitor; a gate electrode of the second reset transistor is coupled to the reset terminal, a first electrode of the second reset transistor is coupled to the initialization voltage terminal, and a second electrode of the second reset transistor is coupled to the second end of the capacitor. the data writing sub-circuit includes a writing transistor having a gate electrode coupled to the scan terminal, a first electrode coupled to the data signal terminal, and a second electrode coupled to the first end of the capacitor. The compensation sub-circuit includes a first compensation transistor having a gate electrode coupled to the scan terminal, a first electrode coupled to the gate electrode of the driving transistor, and a second electrode coupled to the second electrode of the driving transistor. The emission control sub-circuit includes a first emission control transistor and a second emission control transistor, where a gate electrode of the first emission control transistor is coupled to the emission control terminal, a first electrode of the first emission control transistor is coupled to the reference voltage terminal, and a second electrode of the first emission control transistor is coupled to the first end of the capacitor; and a gate electrode of the second emission control transistor is coupled to the emission control terminal, a first electrode of the second emission control transistor is coupled to the second electrode of the driving transistor, and the second electrode of the second emission control transistor is coupled to the first electrode of the light-emitting unit.

In some embodiments, the reset sub-circuit further includes a third reset transistor having a gate electrode coupled to the scan terminal, a first electrode coupled to the first electrode of the light-emitting unit, and a second electrode coupled to the initialization voltage terminal. The compensation sub-circuit further includes a second compensation transistor having a gate electrode coupled to the emission control terminal, and a first electrode and a second electrode both coupled to the second electrode of the first compensation transistor.

As a second aspect, the present disclosure further provides a display device including any one of the display substrates described herein.

As a third aspect, the present disclosure further provides method for fabricating a display substrate having a plurality of pixel regions having a spacing region between adjacent pixel regions. The method includes: forming a pixel circuit in each pixel region on a base substrate, the pixel circuit including a driving transistor; forming an auxiliary conductive layer on the base substrate on which the pixel circuit is formed, a material of the auxiliary conductive layer is the same as a material of a first electrode and a second electrode of the driving transistor; forming an insulating spacer layer on the auxiliary conductive layer, the insulating spacer layer having a via hole penetrating through the insulating spacer layer to expose the auxiliary conductive layer; forming a light-emitting unit in each pixel region, where the light emitting unit includes a first electrode, an organic light-emitting layer and a second electrode, which are sequentially disposed in a direction away from the base substrate, second electrodes of light-emitting units are coupled to be a single piece to form a second electrode layer, and the second electrode layer is coupled to the auxiliary conductive layer through the via hole.

In some embodiments, before the organic light-emitting layer is formed, the method further includes: forming a layer to be removed on a portion of the auxiliary conductive layer exposed by the via hole; and forming a hole injection layer and a hole transport layer sequentially. after the organic light-emitting layer is formed and before the second electrode is formed, the method further includes: forming an electron transport layer and an electron injection layer sequentially; and removing the layer to be removed, so that the hole injection layer, the hole transport layer, the electron transport layer, and the electron injection layer on the layer to be removed are simultaneously removed.

In some embodiments, a space is provided between the layer to be removed and a side wall of the via hole; and the removing the layer to be removed includes: placing the base substrate in a removing solution for dissolving the layer to be removed to remove the layer to be removed.

BRIEF DESCRIPTION OF THE DRAWINGS

The accompanying drawings, which are included to provide a further understanding of the present disclosure and constitute a part of this specification, together with the detailed description serve to explain the present disclosure, but do not limit the present disclosure. In the drawings.

DETAILED DESCRIPTION

To make the objects, technical solutions and advantages of the embodiments of the present disclosure more apparent, the technical solutions of the embodiments of the present disclosure will be clearly and completely described below with reference to the accompany drawings of the embodiments of the present disclosure. It is to be understood that the described embodiments are only some, but not all, embodiments of the present disclosure. All other embodiments, which can be derived by a person skilled in the art from the described embodiments of the present disclosure without inventive step, are within the protection scope of the present disclosure.

The terminology used herein to describe embodiments of the present disclosure is not intended to limit and/or define the scope of the present disclosure. For example, technical or scientific terms used in the present disclosure should have the ordinary meaning as understood by one of ordinary skill in the art, unless otherwise defined. It should be understood that the terms "first", "second" and the like, as used in the present disclosure, do not denote any order, quantity, or importance, but rather are used to distinguish one element from another. The singular forms "a", "an" or "the" and similar referents do not denote a limitation of quantity, but rather denote the presence of at least one, unless the context clearly states otherwise.

Figure 1:
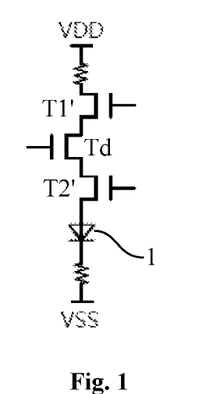
FIG. 1 is a schematic diagram of a light-emitting path in which a light-emitting unit is disposed in the existing art.

In an organic light-emitting diode display panel, a light-emitting unit and a pixel circuit are disposed in each pixel region. FIG. 1 is a schematic diagram of a light-emitting path in which the light-emitting unit is disposed in the existing art. As shown in FIG. 1, a source electrode of a first transistor T1' is coupled to a first power supply terminal VDD, a second electrode of the first transistor T1' is coupled to a source electrode of a driving transistor Td, a drain electrode of the driving transistor Td is coupled to a source electrode of a second transistor T2', a drain electrode of the second transistor T2 is coupled to an anode of a light-emitting unit 1, and a cathode of the light-emitting unit 1 is coupled to a second power supply terminal VSS. Here, a current of the light-emitting unit 1 is controlled by the driving transistor Td, and when the voltage difference Vds between the source and drain electrodes of the driving transistor Td reaches a certain value, the driving transistor Td operates in a saturation region, and at this time, the current flowing through the source and drain electrodes is $Ids=K(Vgs-Vth)^2$. The voltage at the first power supply terminal VDD is transmitted to each pixel circuit through a signal line, and since the signal line has a certain resistance, a voltage drop, referred to as IR Drop, occurs during the voltage transmission process. The length of the signal line from each pixel region to the first power supply terminal VDD is different, which causes the IR Drop corresponding to the pixel circuit in each pixel region to be different, and thus the voltage Vs at the source electrode of the driving transistor Td in different pixel regions is different, which in turn causes the driving current in different pixel circuits to be different, resulting in uneven light emission. In addition, the threshold voltage Vth of the driving transistor Td may vary due to factors such as process and device aging, and thus may cause uneven light emission.

Figure 2:
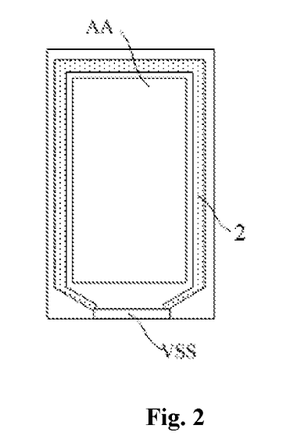
FIG. 2 is a schematic diagram illustrating an arrangement of a signal transmission line in the existing art.

In general, in the display substrate, the cathodes of the light-emitting units 1 are connected to form a whole cathode layer, and the cathode layer is coupled to the second power supply terminal VSS through a signal line 2 in the peripheral area, as shown in FIG. 2. The cathode layer is usually made of Mg/Ag with a large sheet resistance, so that a voltage on the cathode layer generates a large voltage drop (IR Drop), thereby increasing the driving power consumption.

Figure 3:
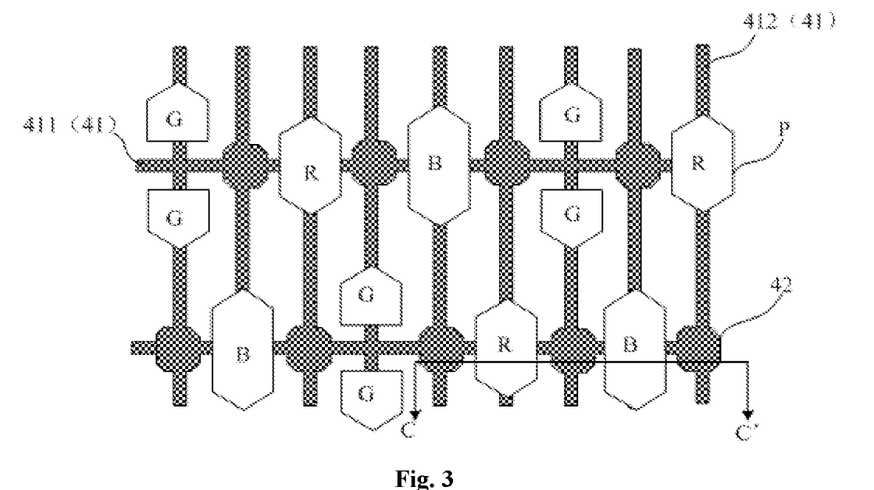
FIG. 3 is a top view illustrating a portion of a display substrate according to some embodiments of the present disclosure.
Figure 4:
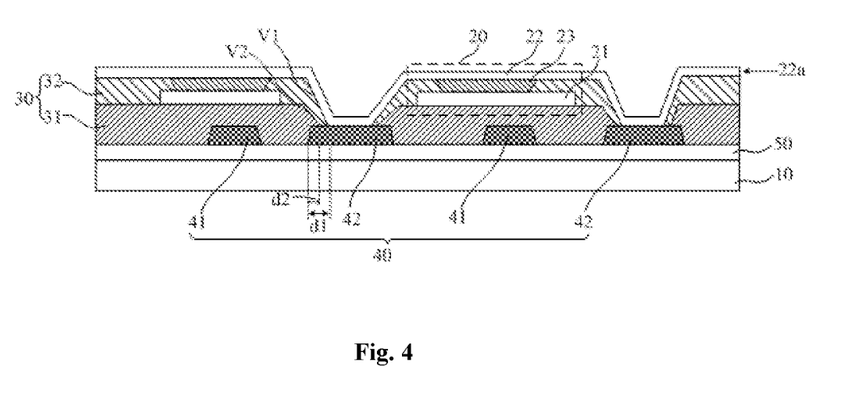
FIG. 4 is a cross-sectional view taken along line C-C' in FIG. 3.
Figure 5A:
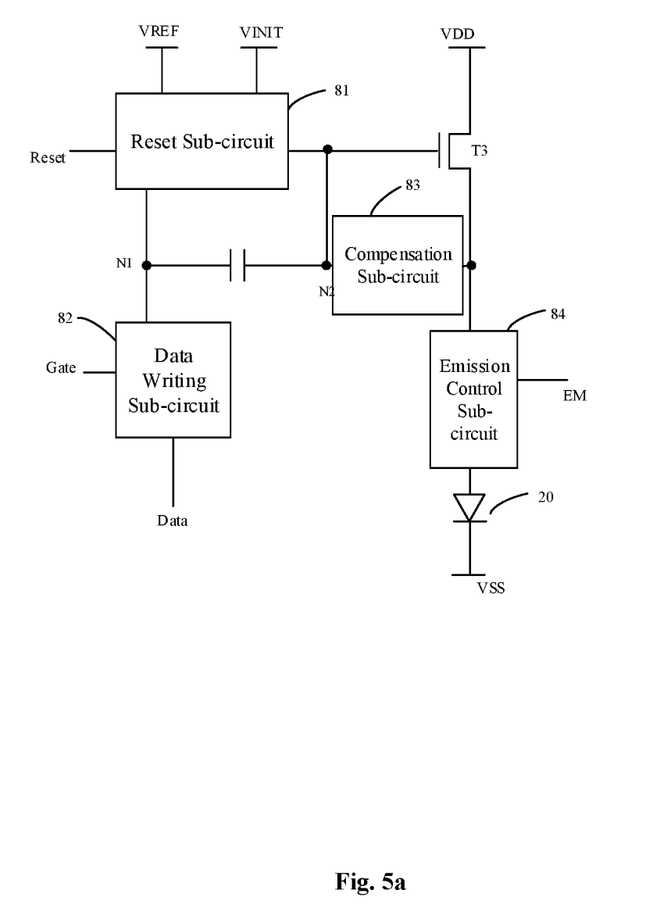
FIG. 5a is a block diagram of a pixel circuit according to some embodiments of the present disclosure.
Figure 5B:
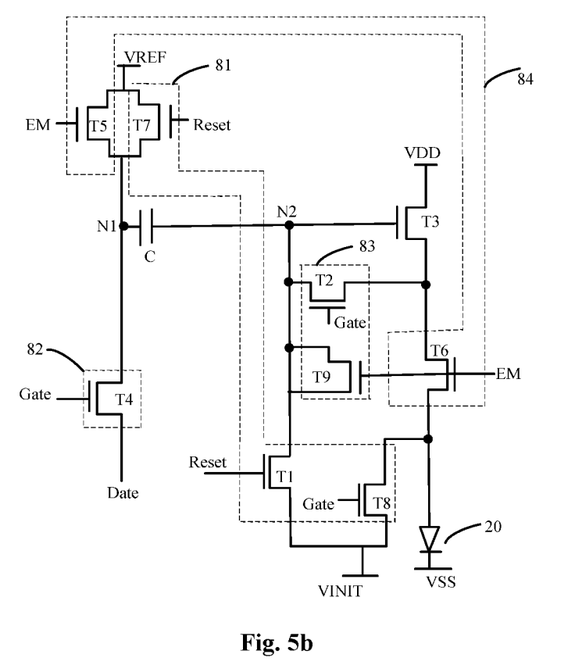
FIG. 5b is a structural diagram of a pixel circuit according to some embodiments of the present disclosure.
Figure 5C:
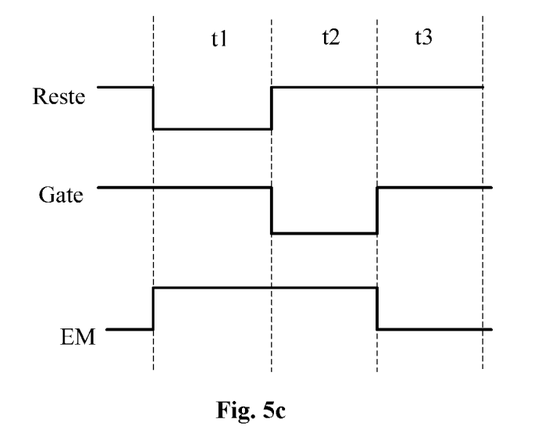
FIG. 5c is a timing diagram of a pixel circuit according to some embodiments of the present disclosure.
Figure 6:
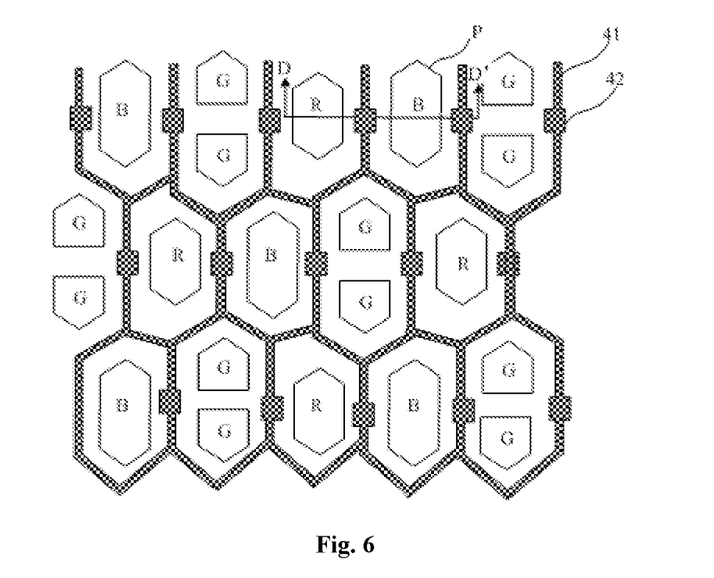
FIG. 6 is a top view illustrating a portion of a display substrate according to some embodiments of the present disclosure.
Figure 7:
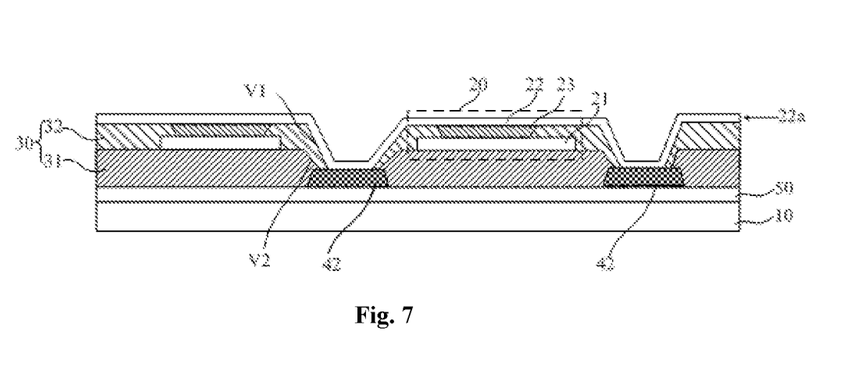
FIG. 7 is a cross-sectional view taken along line D-D' in FIG. 6.
Figure 8:
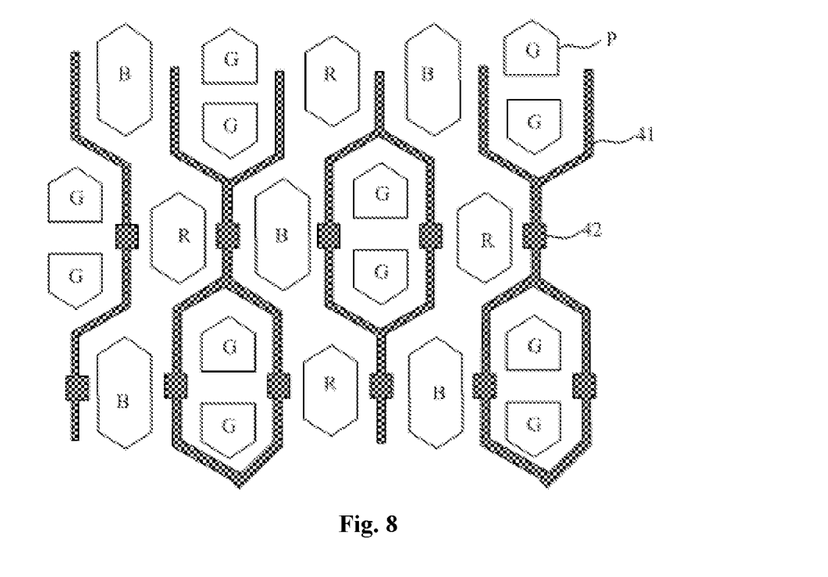
FIG. 8 is a top view illustrating a portion of a display substrate according to some embodiments of the present disclosure.

An embodiment of the present disclosure provides a display substrate, FIG. 3 is a top view illustrating a portion of a display substrate according to some embodiments of the present disclosure, FIG. 4 is a cross-sectional view taken along line C-C' in FIG. 3, FIG. 5a is a block diagram of a pixel circuit according to some embodiments of the present disclosure, FIG. 5b is a structural diagram of a pixel circuit according to some embodiments of the present disclosure, FIG. 5c is a timing diagram of a pixel circuit according to some embodiments of the present disclosure, FIG. 6 is a top view illustrating a portion of a display substrate according to some embodiments of the present disclosure, FIG. 7 is a cross-sectional view taken along line D-D' in FIG. 6, and FIG. 8 is a top view illustrating a portion of a display substrate according to some embodiments of the present disclosure. As shown in FIGS. 3 to 8, the display substrate has a display area AA including a plurality of pixel regions P spaced apart from each other, that is, a space exists between adjacent pixel regions P. The display substrate includes: a base substrate 10, an auxiliary conductive layer 40, a light-emitting unit 20 in each pixel region, and a driving structure layer 50, where the driving structure layer 50 includes a pixel circuit in each pixel region P. The auxiliary conductive layer 40 is located on a side of the pixel circuit away from the base substrate 10.

The light-emitting unit 20 includes a first electrode 21, an organic light-emitting layer 23, and a second electrode 22 sequentially disposed in a direction away from the base substrate 10. The second electrode 22 has an extension portion extending out of the pixel region P, and the extension portion is coupled to the auxiliary conductive layer 40 through a via hole (e.g., via hole V1 in FIG. 4) that does not overlap with the pixel region P. The auxiliary conductive layer 40 is insulated and spaced apart from the first electrode 21 and is in a mesh or chain shape in a plan view (see, for example, FIGS. 3, 6, and 8), and a material of the auxiliary conductive layer 40 is the same as that of the first and second electrodes of the driving transistor.

In some embodiments, the second electrodes 22 of the light-emitting units 20 are connected as a whole to form a second electrode layer 22a, and a portion of the second electrode layer 22a outside the pixel region P is coupled to the auxiliary conductive layer 40 through a via hole. In some embodiments, the light-emitting unit 20 is a light-emitting diode, the first electrode 21 is an anode, and the second electrode 22 is a cathode. In some embodiments, the light-emitting unit 20 may further include: a hole transport layer, a hole injection layer, an electron transport layer and an electron injection layer, where the hole transport layer is located between the first electrode 21 and the organic light-emitting layer 23, the hole injection layer is located between the first electrode 21 and the hole transport layer, the electron transport layer is located between the second electrode and the organic light-emitting layer 23, and the electron injection layer is located between the second electrode and the electron transport layer. The hole injection layers of the light-emitting units 20 may be coupled as a whole film layer, the hole transport layers of the light-emitting units 20 may be coupled as a whole film layer, the electron injection layers of the light-emitting units 20 may be coupled a whole film layer, and the electron transport layers of the light-emitting units 20 may be coupled as a whole film layer. The organic light-emitting layer 23 of each light-emitting unit 20 is independent of each other. In some embodiments, as shown in the figures, the display substrate may further include an insulating spacer layer 30. The insulating spacer layer 30 is located between the second electrode layer 22a and the base substrate 10. A via hole V1 is provided at a position of the insulating spacer layer 30 corresponding to a spacing region. The auxiliary conductive layer 40 is located between the insulating spacer layer 30 and the base substrate 10, the second electrode layer 22a is coupled with the auxiliary conductive layer 40 through the via hole V1, and the auxiliary conductive layer 40 is insulated and spaced apart from the first electrode 21. Here, the insulating spacer layer 30 can prevent the formation process of the auxiliary conductive layer 40 from adversely affecting the second electrode layer 22a or the light-emitting layer 23. Moreover, since the via hole V1 coupling the auxiliary conductive layer 40 with the second electrode layer 22a is located in the spacing region, the display effect of the display substrate will not be affected even if the second electrode layer 22a in the spacing region is affected by the fabrication process of the auxiliary conductive layer 40.

As shown in FIG. 5a, the pixel circuit may include a driving transistor T3, a capacitor C, a reset sub-circuit 81, a data writing sub-circuit 82, a compensation sub-circuit 83, and a emission control sub-circuit 84.

The reset sub-circuit 81 is coupled to a reset terminal Reset, an initialization voltage terminal VINIT, a reference voltage terminal VREF, and both ends of the capacitor C, and the reset sub-circuit 81 is configured to transmit a voltage signal at the reference voltage terminal VREF to a first end (i.e., node N1) of the capacitor C and transmit a voltage signal at the initialization voltage terminal VINIT to a second end (i.e., node N2) of the capacitor C in response to the control of the reset terminal Reset during a reset phase.

A gate electrode of the driving transistor T3 is coupled to the second end of the capacitor C, and a first electrode of the driving transistor T3 is coupled to the first power supply terminal VDD. The material of the auxiliary conductive layer 40 is the same as the material of both the first electrode and the second electrode of the driving transistor T3. In an embodiment, the auxiliary conductive layer 40 and the first and second electrodes of the driving transistor T3 are made of a metal material, for example, the metal material may be a single layer or a lamination of any one or more metals of indium, gallium, zinc, tin, molybdenum, or tungsten, or an alloy thereof.

The data writing sub-circuit 82 is coupled to a scan terminal Gate, a data signal terminal Data, and the first end of the capacitor C, and the data writing sub-circuit 82 is configured to transmit a voltage signal at the data signal terminal Data to the first end of the capacitor C in response to the control of the scan terminal Gate during a data writing phase.

The compensation sub-circuit 83 is coupled to the scan terminal Gate, and the gate electrode and the second electrode of the driving transistor T3, and the compensation sub-circuit 83 is configured to electrically couple the gate electrode of the driving transistor T3 with the second electrode of the driving transistor T3 in response to the control of the scan terminal Gate during a data writing phase to write a voltage at the first power supply terminal VDD and a threshold voltage of the driving transistor T3 into the capacitor C.

The emission control sub-circuit 84 is coupled to a emission control terminal EM, the reference voltage terminal VREF, the second electrode of the driving transistor T3, and the first electrode of the light-emitting unit 20, and the emission control sub-circuit 84 is configured to transmit the voltage signal at the reference voltage terminal VREF to the first end of the capacitor C in response to the control of the emission control signal terminal EM during an emission phase and to electrically couple the second electrode of the driving transistor T3 with the first electrode of the light-emitting unit 20.

The display substrate in the embodiment of the present disclosure is particularly suitable for small-sized display products, such as mobile phones, tablet computers, and the like. The operating process of the pixel circuit includes a reset phase, a data writing phase and an emission phase.

Specifically, during the reset phase, the reset sub-circuit 81 transmits a reference voltage signal at the reference voltage terminal VREF to the first end (i.e., the node N1) of the capacitor C and transmits an initial voltage signal at the initialization voltage terminal VINIT to the second end of the capacitor C (i.e., the node N2) under the control of the reset terminal. Therefore, during the reset phase, the voltage at the node N1 is Vref, the voltage at the node N2 is Vinit, the voltage at the reference voltage terminal VREF is Vref, and the voltage at the initialization voltage terminal VINIT is Vinit.

In the data writing phase, the data writing sub-circuit 82 transmits the voltage signal Vdata at the data signal terminal Data to the node N1 under the control of the scan terminal Gate; the compensation sub-circuit 83 electrically couples the gate electrode of the driving transistor T3 with the second electrode of the driving transistor T3, and at this time, the driving transistor T3 is equivalent to a diode structure, and the voltage at the node N2 reaches Vdd+Vth, thereby writing the voltage Vdd at the first power supply terminal Vdd and the threshold voltage Vth of the driving transistor T3 into the capacitor C.

In the emission phase, the emission control sub-circuit 84 transmits the voltage at the reference voltage terminal VREF to the node N1 under the control of the emission control terminal EM. From the data writing phase to the emission phase, the voltage variation of the node N1 is Vref−Vdata, and the voltage at the node N2 will change from Vdd+Vth of the previous phase to Vdd+Vth+Vref−Vdata due to the voltage stabilization effect of the capacitor C. Therefore, in this phase, the voltage Vg at the gate electrode of the driving transistor T3 is maintained at Vdd+Vth+Vref−Vdata, the voltage Vs at the source electrode of the driving transistor T3 is the voltage Vdd at the first power terminal Vdd, and the driving transistor T3 is in a saturation state. As is clear from the saturated-state current characteristics, the driving current Ioled flowing through the driving transistor T3 satisfies:

$$Ioled=K(Vgs-Vth)^2=K(Vdd+Vth+Vref-Vdata-Vdd-Vth)^2=K(Vref-Vdata)^2$$

where K is a parameter related to the structural characteristics of the driving transistor T3, and may be regarded as a constant. As can be seen from the above formula, the driving current supplied to the light-emitting unit 20 is independent of both the threshold voltage and the voltage at the first power supply terminal, thereby avoiding the drift of the threshold voltage of the driving transistor T3 and preventing the IR Drop related to the first power supply terminal VDD from affecting the driving current. As a result, it is not necessary to fabricate other structures to alleviate the IR Drop related to the first power terminal VDD.

In addition, since the auxiliary conductive layer 40 is coupled to the second electrode layer 22a in the spacing region, which is equivalent to the fact that the auxiliary conductive layer 40 is coupled to the second electrode layer 22a in parallel, the sheet resistance of the whole conductive structure formed by the second electrode layer 22a and the auxiliary conductive layer 40 can be reduced, so that the voltage drop related to the second power supply terminal VSS in the second electrode layer 22a is reduced, and the driving power consumption of the display substrate is also reduced.

FIG. 5b is a structural diagram illustrating a pixel circuit according to some embodiments of the present disclosure, and as shown in FIG. 5b, the reset sub-circuit 81 includes: a first reset transistor T7 and a second reset transistor T1. A gate electrode of the first reset transistor T7 is coupled to the reset terminal Reset, a first electrode of the first reset transistor T7 is coupled to the reference voltage terminal VREF, and a second electrode of the first reset transistor T7 is coupled to the node N1. A gate electrode of the second reset transistor T1 is coupled to the reset terminal Reset, a first electrode of the second reset transistor T1 is coupled to the initialization voltage terminal VINIT, and a second electrode of the second reset transistor T1 is coupled to the second end of the capacitor C. In some embodiments, the reset sub-circuit 81 may be further configured to transmit a voltage signal at the initialization voltage terminal VINIT to the first electrode of the light-emitting unit 20 in response to the control of the scan terminal Gate in the data writing phase. In this case, the reset sub-circuit 81 further includes a third reset transistor T8 having a gate electrode coupled to the scan terminal Gate, a first electrode coupled to the first electrode of the light-emitting unit 20, and a second electrode coupled to the initialization voltage terminal VINIT.

The data writing sub-circuit 82 includes a writing transistor T4 having a gate electrode coupled to the scan terminal, a first electrode coupled to the data signal terminal Data, and a second electrode coupled to the node N2.

The compensation sub-circuit 83 includes a first compensation transistor T2 having a gate electrode coupled to the scan terminal Gate, a first electrode coupled to the gate electrode of the driving transistor T3, and a second electrode coupled to the second electrode of the driving transistor T3. In some embodiments, the emission control sub-circuit 84 may further include a second compensation transistor T9 having a gate electrode coupled to the emission control terminal EM, and a first electrode and a second electrode both coupled to the second electrode of the first compensation transistor T2.

The emission control sub-circuit 84 includes a first emission control transistor T5 and a second emission control transistor T6. A gate electrode of the first emission control transistor T5 is coupled to the emission control terminal EM, a first electrode of the first emission control transistor T5 is coupled to the reference voltage terminal VREF, and a second electrode of the first emission control transistor T5 is coupled to the node N2.

A gate electrode of the second emission control transistor T6 is coupled to the emission control terminal EM, a first electrode of the second emission control transistor T6 is coupled to the second electrode of the driving transistor T3, and the second electrode of the second emission control transistor T6 is coupled to the first electrode of the light-emitting unit 20.

FIG. 5c is a timing diagram of a pixel circuit according to some embodiments of the present disclosure, and the operation of the pixel circuit is described below with reference to FIGS. 5b and 5c. Here, each transistor is a P-type transistor as an example.

In a reset phase t1, the reset terminal Reset provides a low-level signal, and each of the scan terminal Gate and the emission control terminal EM provides a high-level signal. At this time, the first reset transistor T7 and the second reset transistor T1 are turned on, so that the voltage at the node N1 reaches the voltage Vref at the reference voltage terminal VREF, and the voltage at the node N2 reaches the voltage VINIT at the initialization voltage terminal VINIT.

In a data writing phase t2, the scan terminal Gate provides a low-level signal, and each of the reset terminal Reset and the emission control terminal EM provides a high-level signal. At this time, the data writing transistor T4 is turned on, and the voltage signal at the data signal terminal Data is transmitted to the node N1, so that the voltage of the node N1 reaches Vdata; meanwhile, the first compensation transistor T2 electrically couples the gate electrode of the driving transistor T3 with the second electrode of the driving transistor T3, and the voltage at the node N2 reaches Vdd+Vth. In addition, in this phase, the second reset transistor T8 is also in an on state, thereby resetting the voltage at the first electrode of the light-emitting unit 20.

In an emission phase, the emission control terminal EM provides a low-level signal, and each of the reset terminal Reset and the scan terminal Gate provides a high-level signal. At this time, the first emission control transistor T5 is turned on, so that the voltage signal at the reference voltage terminal VREF is transmitted to the node N1, and the voltage at the node N1 is changed from Vdata in the previous phase to Vref. Under the voltage stabilization effect of the capacitor C, the voltage at the node N2 is changed from Vdd+Vth in the previous phase to Vdd+Vth+Vref−Vdata. Meanwhile, the second emission control transistor T6 is turned on, and the driving current flows from the driving transistor T3 to the light-emitting unit 20. Here, the driving current Ioled satisfies:

$$Ioled=K(Vgs-Vth)^2=K(Vdd+Vth+Vref-Vdata-Vdd-Vth)^2=K(Vref-Vdata)^2.$$

In addition, in the emission phase, the first compensation transistor T2 is turned off, the second compensation transistor T9 is turned on, and the second compensation transistor T9 is equivalent to a MOS capacitor to absorb channel charges of the first compensation transistor T2 when the first compensation transistor T2 is turned off, thereby improving the compensation capability.

In some embodiments, as shown in FIGS. 3, 6 and 8, the auxiliary conductive layer 40 includes a plurality of auxiliary conductive blocks 42 and a plurality of auxiliary conductive lines 41. Each of the auxiliary conductive blocks 42 is electrically coupled to a respective one of the second electrodes 22 through a respective one of the vias V1 in the insulating spacer layer 30, each of the auxiliary conductive blocks 42 is electrically coupled to at least one of the auxiliary conductive lines 41, and a width of the auxiliary conductive block 42 is greater than a width of the auxiliary conductive line 41. For example, an orthographic projection of the auxiliary conductive block 42 on the base substrate 10 is rectangular or approximately rectangular, the width of the auxiliary conductive block 42 is two to five times of the width of the auxiliary conductive line 41, and the width of the auxiliary conductive line 41 is set to be small, so that the auxiliary conductive line 41 can be prevented from affecting via holes in other film layers. For example, the width of the auxiliary conductive line 41 is between 3 μm and 14 μm.

In the embodiment of the present disclosure, the driving structure layer 50 further includes a first planarization layer (not shown) disposed on the layer where the pixel circuit is located. The auxiliary conductive layer 40 is located on the first planarization layer. The insulating spacer layer 30 includes a second planarization layer 31 disposed on the first planarization layer, and a pixel defining layer 32 disposed on the second planarization layer 31. The first electrode 21 is coupled to the pixel circuit through a via hole penetrating through the second planarization layer 31 and the first planarization layer. The pixel defining layer 32 has pixel openings corresponding to the pixel regions P one to one, the organic light-emitting layers 23 are located in the pixel openings, and the second electrode layer 22a covers the pixel defining layer 32. In addition, in some embodiments, the spacing region may further include spacers (not shown), which are located on the pixel defining layer 32, and used for supporting the display substrate and the cover plate and providing friction force to prevent misalignment between the display substrate and the cover plate.

In the process for manufacturing the display substrate, after the second planarization layer 31 is formed and before the pixel defining layer 32 is formed, a via hole V2 may be formed in the second planarization layer 31. An orthographic projection of the via hole V2 on the base substrate 10 is located within an orthographic projection of the auxiliary conductive block 42 on the base substrate 10, where a distance d2 is provided between a boundary of the orthographic projection of the via hole V2 on the base substrate 10 and a boundary of the orthographic projection of the auxiliary conductive block 42 on the base substrate 10, and d2 is between 2 μm and 5 μm. Thereafter, the pixel defining layer 32 is formed and a via hole is formed in the pixel defining layer 32, the via hole may be located within the via hole V2 and serves as a via hole V1 coupling the auxiliary conductive layer 40 with the second electrode layer 22a. In some embodiments, an orthographic projection of the via hole V1 on the base substrate 10 is within an orthographic projection of the auxiliary conductive block 42 on the base substrate 10. Further, a distance d1 is provided between a boundary of the orthographic projection of the via hole V1 on the base substrate 10 and a boundary of the orthographic projection of the auxiliary conductive block 42 on the base substrate 10, the distance d1 is larger than d2 by about 2 μm, and exemplarily, d1 is between 4 μm and 7 μm.

In the embodiment of the present disclosure, there may be an overlap between the orthographic projection of the auxiliary conductive line 41 on the base substrate 10 and the orthographic projection of the light-emitting unit 20 on the base substrate 10 (as shown in FIG. 3), or there may be no overlap therebetween (as shown in FIGS. 6 and 8).

FIGS. 3, 6 and 8 illustrate three arrangements of the auxiliary conductive lines by taking the pixel region in the GGRB arrangement as an example, and as shown in FIGS. 3, 6 and 8, the pixel region P includes a red pixel region (a pixel region denoted by R in FIGS. 3, 6 and 8), a green pixel region (a pixel region denoted by G in FIGS. 3, 6 and 8), or a blue pixel region (a pixel region denoted by B in FIGS. 3, 6 and 8). The plurality of pixel regions P of the display substrate are divided into a plurality of pixel groups arranged in a plurality of rows, each pixel group includes two green pixel regions, one red pixel region and one blue pixel region, and an area of each of the red pixel region and the blue pixel region are larger than an area of the green pixel region. In each pixel group, two green pixel regions are arranged along the column direction, and a red pixel region and a blue pixel region are respectively located on both sides of the green pixel region along the row direction. The pixel groups in two adjacent rows are arranged in a staggered manner, that is, each pixel region P corresponds to a spacing region between the pixel regions P in the pixel groups in an adjacent row.

In the embodiment shown in FIG. 3, the auxiliary conductive lines 41 are in a mesh shape in plan view, the plurality of auxiliary conductive lines 41 includes a plurality of first conductive lines 411 and a plurality of second conductive lines 412, and the first conductive lines 411 and the second conductive lines 412 intersect perpendicularly to each other. In some embodiments, the auxiliary conductive block 42 is located at the intersection of the first conductive line 411 and the second conductive line 412, and the width of the auxiliary conductive line 41 is between 5 μm and 14 μm. There is an overlap between an orthographic projection of the auxiliary conductive line 41 on the base substrate 10 and an orthographic projection of the light-emitting unit 20 on the base substrate 10. As shown in FIG. 3, each pixel region P overlaps one second conductive line 412, and one first conductive line 411 is disposed in each row of pixel groups, thereby increasing the number of the auxiliary conductive lines 41. The resistance of the second electrode layer 22a coupled in parallel with the auxiliary conductive layer 40 can be reduced by at least 40% compared to the resistance in a case where the second electrode layer 22a is not coupled in parallel.

In some embodiments, when there is overlap between the orthographic projection of the auxiliary conductive line 41 on the base substrate 10 and the orthographic projection of a respective light-emitting unit 20 on the base substrate 10, the orthographic projection of the auxiliary conductive line 41 passes through the center of the orthographic projection of the respective light-emitting unit 20 to prevent the respective light-emitting unit 20 from generating color separation when emitting light.

In the embodiment shown in FIG. 6, the plurality of auxiliary conductive lines 41 form a mesh structure having a plurality of rows of meshes, and adjacent two rows of meshes are staggered. Here, each mesh is approximately hexagonal in shape, which may surround one or two pixel regions P. In some embodiments, the width of the spacing region between two adjacent pixel regions P is between 15 μm and 30 μm, for example, between 16 μm and 26 μm; and the width of the auxiliary conductive line is between 3 μm and 10 μm.

In the embodiment shown in FIG. 8, the plurality of auxiliary conductive lines 41 form a plurality of chain structures which are arranged at intervals along a first direction (i.e., the row direction, such as the left-right direction in FIG. 8), and each chain structure includes a plurality of polygonal boxes which are sequentially connected along a second direction (i.e., the column direction, such as the up-down direction in FIG. 8), for example, the polygonal boxes are hexagonal boxes. In some embodiments, the width of the space between two adjacent pixel regions P is between 15 μm and 30 μm, for example, between 16 μm and 26 μm; and the width of the auxiliary conductive line is between 3 μm to 10 μm. In the embodiment shown in FIG. 8, the resistance of the second electrode layer 22a coupled in parallel with the auxiliary conductive layer 40 can be reduced by at least about 30% compared to the resistance in a case where the second electrode layer 22a is not coupled in parallel.

It should be noted that, FIG. 3, FIG. 6, and FIG. 8 only show three arrangements of the auxiliary conductive lines 41 by taking the pixel regions in the GGRB arrangement as an example. In practical applications, other arrangements may also be adopted for the pixel regions P, for example, the pixel regions P are arranged in rows and columns, each row includes a plurality of pixel groups, each pixel group includes a red pixel region, a green pixel region, and a blue pixel region, which are arranged in sequence, and the colors of the pixel regions in the same column are the same. In this case, the auxiliary conductive line may be arranged in an intersecting manner in FIG. 3, and the auxiliary conductive line 41 may or may not overlap the pixel region P.

Figure 9:
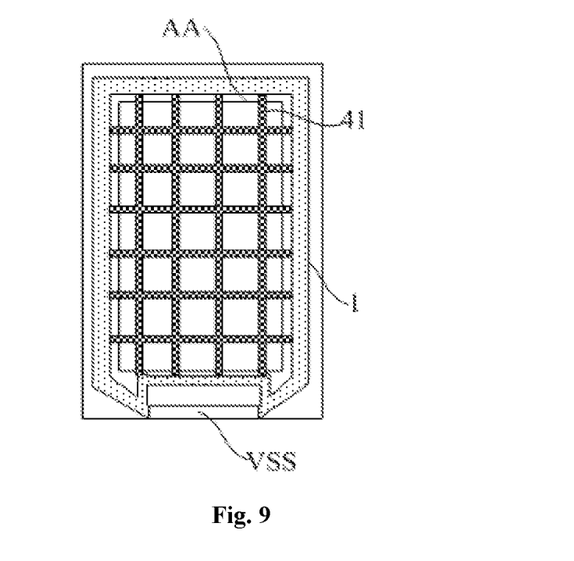
FIG. 9 is an overall schematic diagram illustrating an auxiliary conductive layer and a signal transmission line according to some embodiments of the present disclosure.

FIG. 9 is an overall schematic diagram illustrating an auxiliary conductive layer and a signal transmission line according to some embodiments of the present disclosure, and FIG. 9 illustrates an example where the auxiliary conductive lines 41 are arranged in the arrangement manner shown in FIG. 3, where the signal transmission line 1 is disposed in the peripheral area of the display area AA, and the signal transmission line 1 is coupled to the second power supply terminal VSS. The auxiliary conductive lines 41 may be coupled with the signal transmission line 1.

The embodiment of the present disclosure further provides a method for manufacturing a display substrate, where the display substrate has a display area, the display area includes a plurality of pixel regions, and a spacing region is provided between adjacent pixel regions. The method for manufacturing the display substrate includes: forming a pixel circuit in each pixel region on a base substrate, where the pixel circuit includes the driving transistor, the capacitor, the reset sub-circuit, the data writing sub-circuit, the compensation sub-circuit, and the light-emitting control sub-circuit, as described above, and the pixel circuit may exemplarily adopt the structure shown in FIG. 5b; forming an auxiliary conductive layer on the base substrate on which the pixel circuit is formed, the auxiliary conductive layer being made of the same material as the first and second electrodes of the driving transistor; and forming an insulating spacer layer, wherein a via hole is arranged at a position of the insulating spacer layer corresponding to the spacing region, and the insulating spacer layer includes a pixel defining layer and a second planarizing layer; and forming a light-emitting unit in each pixel region, wherein the light-emitting unit includes a first electrode, an organic light-emitting layer and a second electrode which are arranged along a direction away from the base substrate, the second electrodes of the light-emitting units are coupled into a whole to form a second electrode layer, and the second electrode layer is coupled with the auxiliary conductive layer through a via hole.

It should be noted that the light-emitting unit is not necessarily formed after the insulating spacer layer is completely formed. For example, the insulating spacer layer may include a second planarization layer and a pixel defining layer, the first electrode of the light-emitting unit may be formed after the second planarization layer, and the organic light-emitting layer and the second electrode may be formed after the pixel defining layer.

A method for manufacturing a display substrate according to an embodiment of the present disclosure is described below with reference to FIGS. 10 to 18. The method includes steps S1 to S11.

Figure 10:
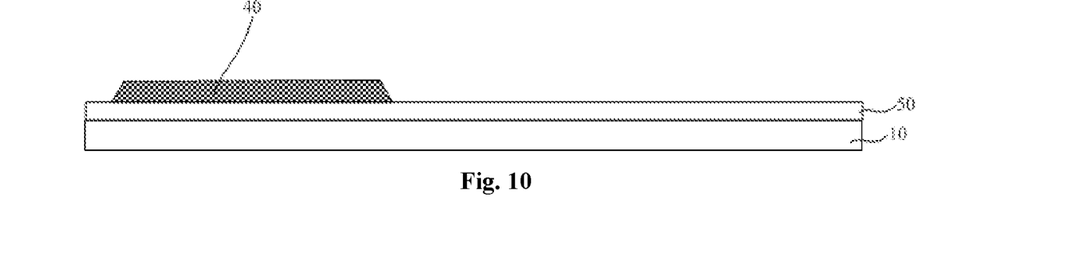
FIGS. 10 to 18 are schematic views illustrating a process for manufacturing a display substrate according to some embodiments of the present disclosure.

In step S1, a driving structure layer 50 is formed on the base substrate 10, as shown in FIG. 10. The driving structure layer 50 includes a buffer layer, a pixel circuit, a first planarization layer, and the like.

In step S2, an auxiliary conductive layer 40 is formed, as shown in FIG. 10. The auxiliary conductive layer 40 may include auxiliary conductive blocks and auxiliary conductive lines, which may be arranged in any one manner shown FIG. 3, FIG. 6, or FIG. 8.

Figure 11:
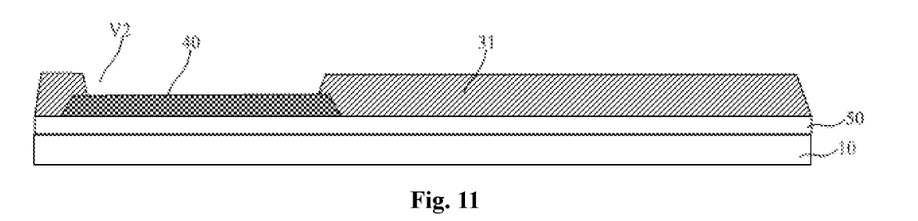

In step S3, a second planarizing layer 31 is formed, and a via hole V2 is formed in the second planarizing layer 31 at a position corresponding to the auxiliary conductive layer 40, as shown in FIG. 11.

Figure 12:
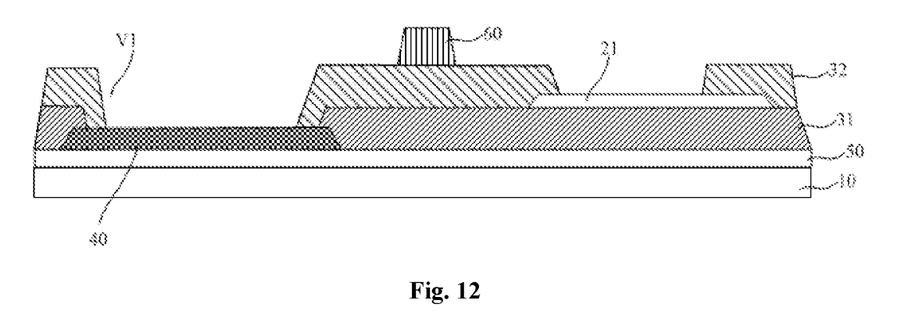

In step S4, a first electrode 21 of a light-emitting unit 20 is formed in each pixel region, as shown in FIG. 12.

In step S5, a pixel defining layer 32 is formed, and a via hole V1 at a position in the pixel defining layer 32 corresponding to the auxiliary conductive layer 40 is formed; thereafter, a spacer 60 may also be formed, as shown in FIG. 12.

Figure 13:
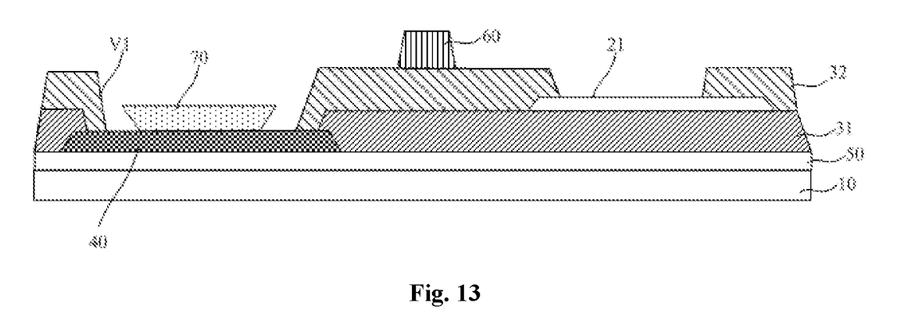

In step S6, a layer 70 to be removed is formed on a portion of the auxiliary conductive layer 40 exposed by the via hole V1, as shown in FIG. 13, with a space between the layer 70 to be removed and a sidewall of the via hole V1.

Figure 14:
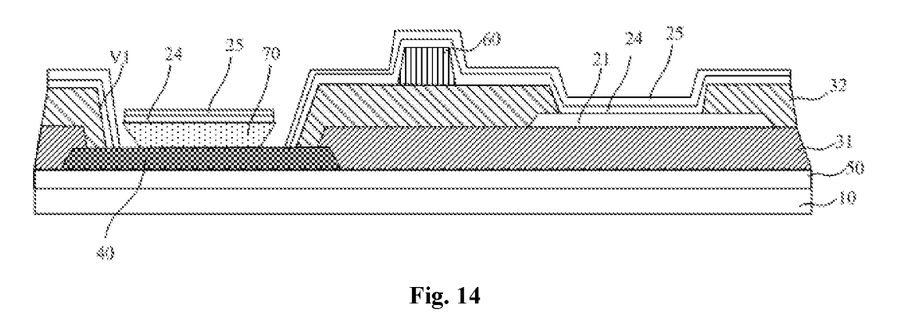

In step S7, a hole injection layer 24 and a hole transport layer 25 are formed in sequence, where the hole injection layer 24 and the hole transport layer 25 both cover an upper surface of the layer 70 to be removed, as shown in FIG. 14.

Figure 15:
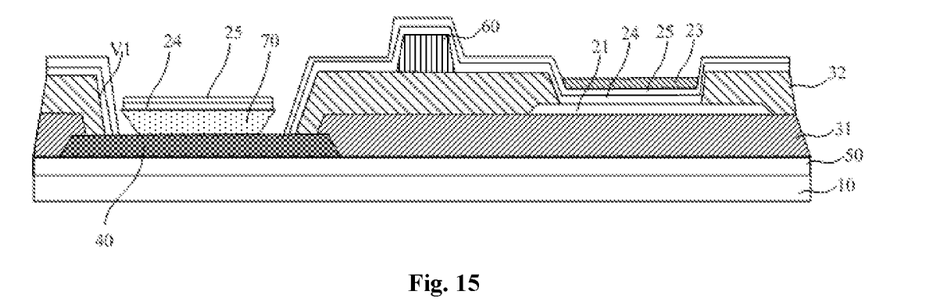

In step S8, an organic light-emitting layer 23 of the light-emitting unit 20 is formed in each pixel region, as shown in FIG. 15.

Figure 16:
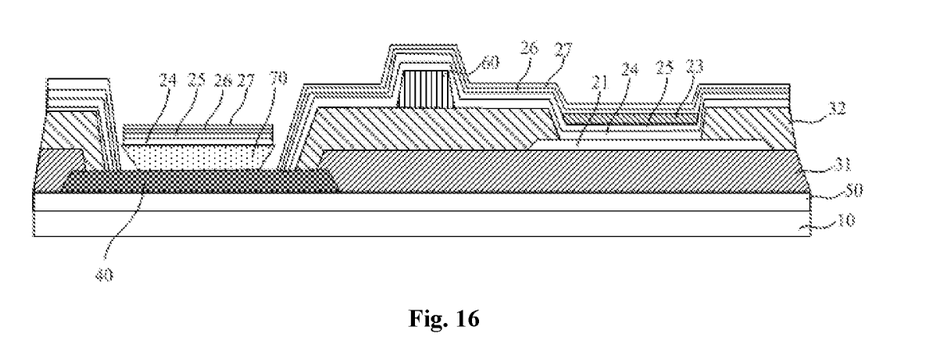

In step S9, an electron transport layer 26 and an electron injection layer 27 are formed in sequence, where the electron transport layer 26 and the electron injection layer 27 both cover the layer 70 to be removed, as shown in FIG. 16.

Figure 17:
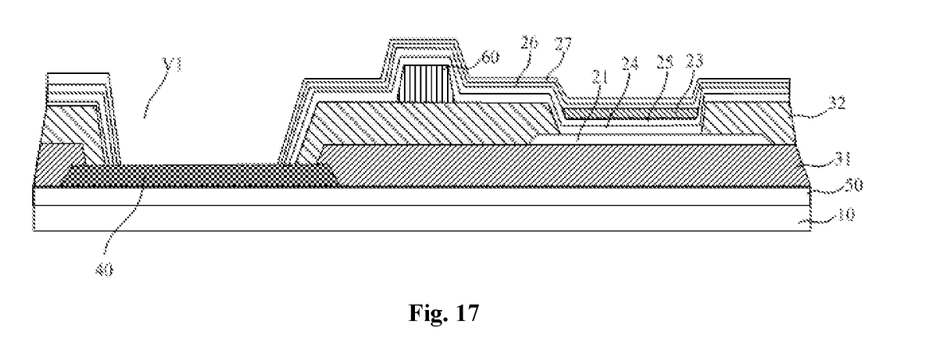

In step S10, the layer 70 to be removed is removed, so that the hole injection layer 24, the hole transport layer 25, the electron transport layer 26, and the electron injection layer 27 on the layer 70 to be removed are simultaneously removed, as shown in FIG. 17.

In some embodiments, step S10 may exemplarily include placing the base substrate 10 in a removing solution for dissolving the layer to be removed to remove the layer 70 to be removed. The removing solution should be selected to have no influence on other film layers of the light-emitting unit 20, for example, a fluoroether-based solvent.

Figure 18:
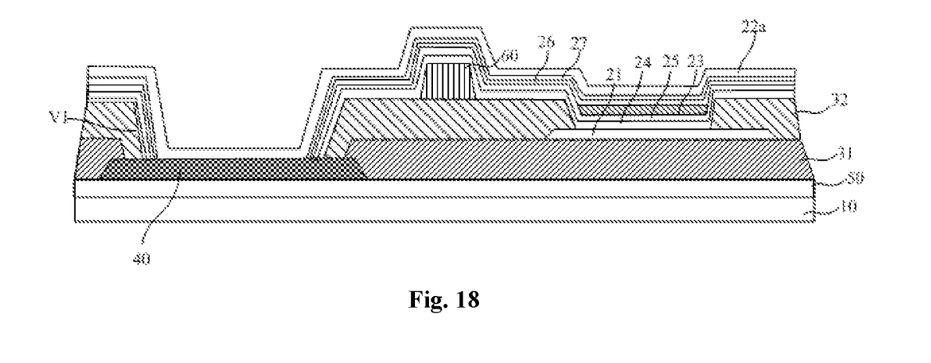

In step S11, a second electrode layer 22a is formed, as shown in FIG. 18, and the second electrode layer 22a is coupled to the auxiliary conductive layer 40 through the via hole in the insulating spacer layer 30.

The embodiment of the present disclosure also provides a display device, which includes the above-described display substrate.

Specifically, the display device may be any small-sized product or component with a display function, such as an electronic paper, a mobile phone, a tablet computer and the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and essence of the present disclosure, and these changes and modifications are to be considered within the protection scope of the present disclosure.

What is claimed is:

1. A display substrate having a plurality of pixel regions spaced apart from each other, the display substrate comprising:
    a base substrate;
    a light-emitting unit in each pixel region and comprising a first electrode, an organic light-emitting layer, and a second electrode, which are sequentially disposed in a direction away from the base substrate;
    an auxiliary conductive layer between the light-emitting unit and the base substrate in a vertical direction;
    a pixel circuit in each pixel region and comprising a driving transistor configured to supply a driving current to the light-emitting unit,
    wherein the auxiliary conductive layer is on a side of the pixel circuit away from the base substrate, each of the second electrode has a portion extending out of the pixel region and coupling to the auxiliary conductive layer through a via hole not overlapping the pixel region, the auxiliary conductive layer is insulated and spaced apart from the first electrode and has a mesh or chain shape in a plan view, and a material of the auxiliary conductive layer is the same as a material of each of the first electrode and the second electrode of the driving transistor, wherein second electrodes of the light-emitting units are coupled to be a single piece to form a second electrode layer, and a portion of the second electrode layer outside the pixel region is coupled to the auxiliary conductive layer through the via hole.

2. The display substrate of claim 1, wherein the light-emitting unit is a light-emitting diode, and the second electrode is a cathode of the light-emitting diode.

3. The display substrate of claim 1, further comprising:
an insulating spacer layer between the second electrode layer and the base substrate and with the via hole penetrating through the insulating spacer layer.

4. The display substrate of claim 1, wherein the auxiliary conductive layer comprises a plurality of auxiliary conductive blocks and a plurality of auxiliary conductive lines, each of the plurality of auxiliary conductive blocks is electrically coupled to a corresponding one of the second electrodes through a corresponding one of the via holes and is electrically coupled to at least one auxiliary conductive line, and a width of the auxiliary conductive block is larger than a width of the auxiliary conductive line.

5. The display substrate of claim 4, wherein an orthographic projection of the via hole on the base substrate is within an orthographic projection of the auxiliary conductive block on the base substrate.

6. The display substrate of claim 5, wherein a space between a boundary of the orthographic projection of the via hole on the base substrate and a boundary of the orthographic projection of the auxiliary conductive block on the base substrate is between 4 µm and 7 µm.

7. The display substrate of claim 4, wherein the width of the auxiliary conductive block is two to five times the width of the auxiliary conductive line.

8. The display substrate of claim 4, wherein the plurality of auxiliary conductive lines are in a mesh shape in plan view, and an orthographic projection of the auxiliary conductive line overlaps with an orthographic projection of the light-emitting unit on the base substrate.

9. The display substrate of claim 8, wherein the orthographic projection of the auxiliary conductive line on the base substrate penetrates through a center of an orthographic projection of at least one light-emitting unit on the base substrate.

10. The display substrate of claim 8, wherein the plurality of auxiliary conductive lines includes a plurality of first conductive lines and a plurality of second conductive lines intersecting perpendicularly to each other.

11. The display substrate of claim 10, wherein the orthographic projection of the auxiliary conductive line on the base substrate does not overlap with an orthographic projection of the light-emitting unit on the base substrate.

12. The display substrate of claim 11, wherein the plurality of auxiliary conductive lines constitute a mesh structure having a plurality of rows of meshes, and adjacent two rows of the meshes are staggered.

13. The display substrate of claim 11, wherein the plurality of auxiliary conductive lines constitute a plurality of chain structures spaced apart from each other in a first direction, and each of the plurality of chain structures comprises a plurality of polygonal boxes connected sequentially in a second direction.

14. The display substrate of claim 1, wherein the pixel circuit further comprises a capacitor, a reset sub-circuit, a data writing sub-circuit, a compensation sub-circuit and an emission control sub-circuit,
the reset sub-circuit is configured to transmit a voltage signal at a reference voltage terminal to a first end of the capacitor and transmit a voltage signal at an initialization voltage terminal to a second end of the capacitor in response to a control of a reset terminal during a reset phase;
a gate electrode of the driving transistor is coupled to the second end of the capacitor and a first electrode of the driving transistor is coupled to a first power supply terminal;
the data writing sub-circuit is configured to transmit a voltage signal at a data signal terminal to the first end of the capacitor in response to a control of a scan terminal during a data writing phase;
the compensation sub-circuit is configured to electrically couple the gate electrode of the driving transistor with a second electrode of the driving transistor in response to a control of the scan terminal during a data writing phase to write a voltage at the first power supply terminal and a threshold voltage of the driving transistor into the capacitor;
the emission control sub-circuit is configured to transmit the voltage signal at the reference voltage terminal to the first end of the capacitor in response to a control of the emission control signal terminal during an emission phase and to electrically couple the second electrode of the driving transistor with a first electrode of the light-emitting unit.

15. The display substrate of claim 1, wherein the reset sub-circuit comprises a first reset transistor and a second reset transistor, wherein
a gate electrode of the first reset transistor is coupled to the reset terminal, a first electrode of the first reset transistor is coupled to the reference voltage terminal, and a second electrode of the first reset transistor is coupled to a first end of the capacitor;
a gate electrode of the second reset transistor is coupled to the reset terminal, a first electrode of the second reset transistor is coupled to the initialization voltage terminal, and a second electrode of the second reset transistor is coupled to the second end of the capacitor;
the data writing sub-circuit comprises a writing transistor having a gate electrode coupled to the scan terminal, a first electrode coupled to the data signal terminal, and a second electrode coupled to the first end of the capacitor;
the compensation sub-circuit comprises a first compensation transistor having a gate electrode coupled to the scan terminal, a first electrode coupled to the gate electrode of the driving transistor, and a second electrode coupled to the second electrode of the driving transistor;
the emission control sub-circuit comprises a first emission control transistor and a second emission control transistor, a gate electrode of the first emission control transistor is coupled to the emission control terminal, a first electrode of the first emission control transistor is coupled to the reference voltage terminal, and a second electrode of the first emission control transistor is coupled to the first end of the capacitor; and
a gate electrode of the second emission control transistor is coupled to the emission control terminal, a first electrode of the second emission control transistor is coupled to the second electrode of the driving transistor, and the second electrode of the second emission control transistor is coupled to the first electrode of the light-emitting unit.

16. A display device comprising the display substrate of claim 1.

17. A method for fabricating the display substrate of claim 1, comprising:
- forming a pixel circuit in each pixel region on a base substrate, the pixel circuit comprising a driving transistor;
- forming an auxiliary conductive layer on the base substrate on which the pixel circuit is formed, a material of the auxiliary conductive layer is the same as a material of each of a first electrode and a second electrode of the driving transistor;
- forming an insulating spacer layer on the auxiliary conductive layer, the insulating spacer layer having a via hole penetrating through the insulating spacer layer to expose the auxiliary conductive layer;
- forming a light-emitting unit in each pixel region, wherein the light emitting unit comprises a first electrode, an organic light-emitting layer and a second electrode, which are sequentially disposed in a direction away from the base substrate, second electrodes of light-emitting units are coupled to be a single piece to form a second electrode layer, and the second electrode layer is coupled to the auxiliary conductive layer through the via hole.

18. The method of claim 17, wherein before the organic light-emitting layer is formed, the method further comprises:
- forming a layer to be removed on a portion of the auxiliary conductive layer exposed by the via hole; and
- forming a hole injection layer and a hole transport layer sequentially; and
- after the organic light-emitting layer is formed and before the second electrode is formed, the method further comprises:
- forming an electron transport layer and an electron injection layer sequentially; and
- removing the layer to be removed, so that the hole injection layer, the hole transport layer, the electron transport layer, and the electron injection layer on the layer to be removed are simultaneously removed.

19. The method of claim 18, wherein a space is provided between the layer to be removed and a side wall of the via hole; and
- the removing the layer to be removed comprises: placing the base substrate in a removing solution for dissolving the layer to be removed to remove the layer to be removed.

* * * * *